United States Patent [19]

McCune, Jr. et al.

[11] Patent Number: 4,871,651
[45] Date of Patent: Oct. 3, 1989

[54] CRYOGENIC PROCESS FOR METAL LIFT-OFF

[75] Inventors: Robert C. McCune, Jr., Birmingham; Louis Toth, Garden City, both of Mich.; Robert S. Bailey, Newport News, Va.

[73] Assignee: Ford Motor Copmpany, Dearborn, Mich.

[21] Appl. No.: 211,648

[22] Filed: Jun. 27, 1988

[51] Int. Cl.⁴ .............................................. G03C 5/00
[52] U.S. Cl. ................................. 430/315; 430/324; 430/329

[58] Field of Search ............... 430/313, 315, 324, 329; 437/229

[56] References Cited

U.S. PATENT DOCUMENTS 4,631,250 12/1986 Hayashi .............................. 430/329
4,662,989 5/1987 Casey et al. ........................ 156/655

Primary Examiner—José G. Dees
Attorney, Agent, or Firm—Lorraine S. Melotik; Roger L. May

[57] ABSTRACT

This invention is directed to a process for the cryogenic lift-off of metal/resist material from a surface of a substrate.

9 Claims, 2 Drawing Sheets

CRYOGENIC PROCESS FOR METAL LIFT-OFF

FIELD OF THE INVENTION

This invention is directed to a process for the cryogenic lift-off of metal/resist material from a surface of a substrate, e.g., from a surface of semiconductor material, and is useful as in the fabrication of microelectronic devices.

BACKGROUND OF THE INVENTION

A patterned conductor layer may be formed on a substrate by various methods well known in the field of electronic device fabrication. Subtractive etching is one common method. In subtractive etching, after a blanket conductor layer is deposited on the substrate, the layer is etched through a photoresist mask in order to remove undesired portions thereof. Such processes suffer from a number of disadvantages which restrict their application, particularly in the fabrication of integrated circuit structures having exceptionally small regions. For example, to ensure complete etch removal of deposited material, the pattern must generally be at least slightly over-etched, leading to diminished line widths for particular line spacing. Although this problem may be lessened by using plasma or reactive ion etching, these processes, in turn, create chemical contamination and possible radiation damage problems which must also be solved.

Many of these disadvantages can be circumvented by the use of a lift-off process, another common method for forming a patterned conductor layer. In lift-off, a layer of resist material is deposited on a substrate, patterned and developed so that the resist covers those portions of the substrate which are not to have a coating of a conductor material. Generally, the resist layer is exposed and developed in such a way that the pattern side walls of the resist defining uncovered areas of the substrate have an undercut profile. Next, a metal conductor layer is deposited over the entire surface. If the side walls of the resist have an undercut profile, the portion of the metal layer lying on the surface of the resist will be discontinuous from that lying on the uncovered areas of the substrate, i.e., discontinuous at the resist pattern edges. The unwanted portion of the metal layer, i.e., that lying on the surface of the resist, is then removed and "lifted off" by exposing the resist to a suitable solvent which causes dissolution of the underlying resist material taking with it the unwanted portions of the conductive layer.

Of these two techniques, it has been found that the lift-off process is sometimes more desirable in that the solvents used to remove the resist cause less damage to the underlying substrate than do the various etch processes, e.g., chemical, plasma, or reactive ion etch, used in subtractive etching. Also, because the conductor profile resulting from lift-off processing does not necessarily exhibit undercut features prominent in etched structures, step coverage problems in subsequent dielectric or conductor layers may be minimized.

One example of a lift-off process is disclosed in U.S. Pat. No. 4,662,989 to Casey et al. As known in the art and as acknowledged in that patent, conventional photoresist lift-off processes for metal layers typically require many hours of soaking in a solution before the desired metal layer can be removed. This is because the solution must penetrate the photoresist through the relatively small area of the resist side walls since access to the photoresist's top surface is blocked by the metal covering. According to that patent, the lift-off time may be substantially reduced by applying an additional layer of material on the metal so that the additional material causes microcracks to develop in the metal layer and in the additional layer of material. These microcracks are meant to increase the access of the solvent to the photoresist and thus shorten the amount of time required for the photoresist to be dissolved. U.S. Pat. No. 4,631,250 to Hayashi discloses a process for the removal of a covering film from the surface of a substrate, e.g., a mask used during etching of the substrate. More particularly, it is taught therein that the film is removed by blasting the film with $CO_2$ particles, which may be mixed with fine ice particles. While that process may be suitable to remove a photoresist mask from a substrate surface, it would be less suitable for use in a situation where the film on the surface included discontinuous portions of metal and metal/resist. Blasting $CO_2$ particles against the surface of the substrate would tend to undesirably and indiscriminately remove the metal conductor portions as well as the metal/resist portions.

BRIEF DESCRIPTION OF THE INVENTION

The invention is directed to a process for the cryogenic lift-off of metal/resist material from the surface of a substrate. As used herein, the term "metal/resist material" means a layer of metal on top of a layer of resist which is lifted off the substrate by the process of this invention. The invention would be useful, e.g., to remove metal/resist material from the surface of semiconductor material in the fabrication of a microelectronic structure. The process comprises first providing a layer of resist material in a desired pattern on a surface of a substrate, e.g., a semiconductor material such as a wafer of silicon. The substrate possess a coefficient of thermal expansion different from that of the resist material applied thereon. The layer (i) defines uncovered surface areas of the substrate and (ii) has undercut side walls adjacent the uncovered surface areas. Thereafter the process comprises applying a layer of metal. A first portion of the metal will deposit on the surface of the resist material and a second portion of the metal will deposit on uncovered surface areas of the substrate, forming a layered article. The layered article comprises at least the layer of metal, the layer of resist material and the surface of the substrate carrying the layers of metal and resist. The metal is adherent to the surface of the substrate and it is applied so that the aforesaid first portion and second portion thereof are not in contact with each other. That is, the first portion of the metal layer which lies on the surface of the resist is discontinuous from that which lies on the uncovered surface areas of the substrate.

The layered article is then subjected to a temperature sufficiently low to cause the resist layer to detach from the surface of the substrate, e.g., by subjecting the layered article to liquid nitrogen.

This invention also is directed to a substrate carrying a patterned layer of metal made by the process disclosed above.

We have found that, by using the cryogenic lift-off process of this invention, unwanted metal and resist rapidly detach from the surface of the substrate. As mentioned above, a potential drawback with conventional solvent lift-off processes is that they may take relatively long periods of time to be effective. A conventional solvent lift-off process is particularly inconvenient and commercially undesirable when large areas of unwanted metal are to be lifted-off. We have found that the lift-off of a large area of resist/metal, that would have conventionally required as much as 8 hours of exposure to solvent, can be done according to preferred embodiments of the process of this invention in as little as about 30 seconds. Thus, one advantage of the present process is that it substantially reduces the time necessary to lift-off the resist/metal, typically to a time on the order of seconds, significantly reducing cost and cycle time.

Conventional solvent lift-off processes use solvents such as acetone to dissolve the resist which cause the unwanted metal film on top of the resist to lift-off the substrate. Acetone, when used in the workplace, requires conditions which limit worker contact and it requires special disposal techniques. It is another advantage of the present invention is that it doesn't require the use of a solvent which may pose such special handling considerations. According to the invention process, the low temperature conditions which cause the resist layer to detach from the surface of the substrate can be provided by liquid nitrogen. Liquid nitrogen does not require isolation from workers and does not involve special disposal considerations, although, normal precautions in handling cryogenic materials should be observed.

DETAILED DESCRIPTION OF THE INVENTION

Figure 1:
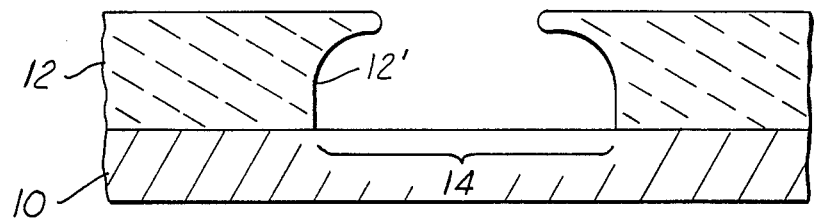
FIGS. 1, 2 and 3 illustrate a process according to the present invention.

With references to FIGS. 1, 2, and 3, a preferred embodiment of the invention will now be described. As shown in FIG. 1, a layer of resist material 12 is provided in a desired pattern on a surface of a substrate 10 (shown as a semiconductor material, e.g., silicon). The resist 12 defines uncovered surface areas 14 and has undercut side walls 12' adjacent the uncovered surface areas 14.

Numerous substrate materials, to which it would be desirable to apply a patterned layer of metal according to the process of this invention, will be apparent to those skilled in the art in view of the present disclosure. Exemplary of such materials which are commercially available are semi-conductor materials, glass, sapphire and polished alumina. Preferably, the substrate material has a high degree of surface polish. The substrate also should possess a coefficient of thermal expansion different from that of the resist materials applied thereon.

Semiconductor materials useful as the substrate in the process of this invention will be apparent to those skilled in the integrated circuit and micro-sensor technology fields in view of the present disclosure. Exemplary of such materials are silicon, gallium arsenide, and indium phosphide. The semiconductor material would generally be of the type and doping levels commonly used in the semiconductor industry. For example, if silicon is the semiconductor material used, it could be p- or n-type doped silicon. According to the invention, the substrate may be of any of various shapes, generally, however for use in microelectronic devices, the substrate would be a wafer, e.g, being a disc having two broad faces and a thin cylindrical edge surface or being a rectangular solid having two broad faces and four thin edge surfaces. Fragments or sections of a wafer could also be used instead of a complete wafer. Preferably for microelectronic applications, the substrate would be single crystal silicon wafers of (100) or (111) crystal orientation.

As described above, according to the invention a resist material, shown as 12 in FIG. 1, is provided in a desired pattern on a surface of a substrate 10. The resist material may be selected from any of the known various types of resist material, including, but not limited to, electron beam resists and photoresists. Photoresist materials are commonly used in a wide number of industrial processes where it is desired to provide detailed pattern on a substrate surface in thin films applied thereto or to provide regions of altered character as contrasted to other surface portions of the substrate. Such photoresist materials are photo sensitive in nature, being characterized by a differential reactivity to specific liquid solvents after exposure to actinic radiation or other energy source effective for the particular photoresist material used, such as ultraviolet radiation. A standard photographic practice in employing photoresist layers as patterns involves the application of a layer of photoresist material to a substrate, followed by the selective exposure of the photoresist layer to an energy source, wherein portions of the photoresist layer are changed in character due to their exposure to the energy source. After such exposure, the photoresist layer is then developed by a "wet development process" employing liquid chemical solvents to selectively remove portions of the photoresist for providing the desired pattern therein. Negative and positive photoresist materials are available for this purpose. In a negative photoresist material, the portion of a layer thereof exposed to the energy source is changed in its chemical character being polymerized as contrasted to the nonexposed portion and rendering it insoluble with respect to the liquid chemical solvent which removes the nonexposed portion of the negative photoresist layer in producing the desired pattern therein. Exemplary of a negative photoresist material is Hunt HNR (trademark, Apache Chemicals, Div., Hunt Chemical Corp., Seward, Ill.).

For a positive photoresist layer, the situation is reversed in that the portion thereof exposed to the energy source is rendered soluble to the liquid solvent, while the nonexposed portion is insoluble with respect thereto and remains after development in forming the desired pattern. Exemplary of such positive photoresist materials are Shipley MP 1470 (trademark, Shipley Co., Inc., Newton, Mass.), and MacDermid 914 (trademark, Mac Dermid, Inc., Waterbury, Conn.). Positive photoresist materials are preferred for use in the process of this invention.

Preferably, in this invention, the resist material is processed to a soft cure, i.e., the resist material is cured at a lower temperature so as to leave the resist material at less than maximum hardness. It has been found that photoresist materials which have been soft cured detach more rapidly from the surface of the substrate according to this invention when subjected to sufficiently low temperatures than photoresist materials which have been cured to maximum hardness when subjected to the same temperatures.

Formation of undercut side walls in the resist material can be done by numerous techniques well known to those skilled in the art. One way to obtain the undercut structure is to apply a coating of two or more resist layers with widely different solubilities. After, e.g., an electron beam exposure, a developer is chosen that develops the top layer at least 10 times slower than the bottom layer. Alternately, two mutually exclusive developers can be used for the successive development of the two layers. Both of these approaches result in undercut resist profiles suitable for the cryogenic lift-off of metal according to the invention. Still another method for forming an undercut resist layer involves using a single layer of uv-exposed resist whose surface has been modified before or after exposure by means of a chlorobenzene soak process. The chlorobenzene modifies the resist layer so as to reduce the solubility of the modified layer in the developer solution. In this way undercut side walls are formed in resist. This last technique is described in detail in "Single-Step Optical Lift-Off Process" by M. Hatzakis et al, IBM J. Res. Develop., Vol. 24, No. 4, July 1980. Techniques such as those described above as well as others known in the art may be employed to provide a discontinuous layer of resist material having undercut side walls according to the process of the invention.

Figure 2:
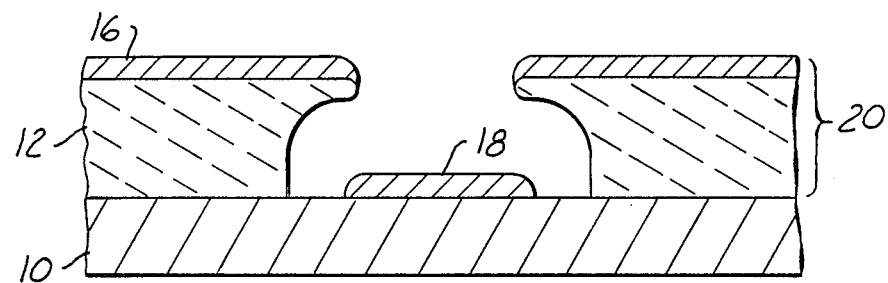

Referring now to FIG. 2, after providing a layer of resist material 12 having undercut side walls 12' on a surface of substrate 10, the process further comprises applying a layer of metal. A first portion 16 of the metal will deposit on the surface of the resist material 12 and a second portion 18 of the metal will deposit on the an uncovered surface area 14 of the substrate 10, forming a layered article 20. The metal is selected from any metal which is suitably adherent to the substrate. Exemplary of metals which can be used as this layer in the invention include aluminum, iron, nickel, copper, lead, silver, chromium, tungsten, tin, platinum, molybdenum, gold and their alloys. Selection of one of these or still another metal will be within the skill of those in the art in view of the present disclosure. Selection of the optimal metal to be so employed will depend on such considerations as its electrical and thermal conductivity, melting point, and corrosion resistance in view of the intended use of a device made using the invention process.

The layer of metal is applied so that the first portion of the metal 16 and the second portion of the metal 18 do not contact each other. The metal may be applied by any suitable technique including, e.g., sputtering or evaporation techniques, which are well known to those skilled in the art. Exemplary of those techniques are those taught in the texts: *Thin Film Processes*, edited by John L. Vossen and Werner Kern, Academic Press, N.Y., 1978, and *Thin Films Phenomena* by K. L. Chopra, McGraw Hill, N.Y., 1969. The first portion 16 of the metal and the second portion 18 of the metal are applied so that they do not contact one another in order that when the resist layer 12 detaches according to the invention process taking with it the first portion 16 of metal deposited on the resist layer, the second portion 18 of the metal is not affected. In order to conveniently apply first and second portions of metal which do not touch by techniques most commonly used in the art area, generally the thickness of the applied metal layer would be no thicker than that of the resist layer. In microelectronic devices, the thickness of a metal layer applied on a semiconductor substrate is generally between about 0.1 and about 2 $\mu$m. While the metal layer applied in the process disclosed herein is not limited to any particular thickness, its thickness is understood to be optimally inherently linked to the resist thickness in the manner described.

The profile of the second portion 18 of metal as shown in FIG. 2 would be that which results when the metal is applied by commonly used techniques such as evaporation or sputtering, preferably the former, from a source above the substrate surface. Using such techniques, the undercut resist layer 12 would cause application of the second portion 18 of the metal layer in a pattern which does not cover entire uncovered surface areas 13 of the substrate, but rather covers a region of the uncovered surface areas of the substrate surface which are exposed by the undercut edges of the resist layer 12. This causes the second portion 18 of the metal layer to be spaced apart from the undercut sides 12' of the resist layer in proximity thereto. While, as described above, this profile is that obtained by commonly used techniques for applying a metal layer, the invention process does not require such a profile for the second portion 12 of the metal layer. The second portion of the metal layer may cover all uncovered surface areas of the substrate surface or a part thereof, as described above. The second portion may also contact the sides 12', in part or in total, of the resist layer 12, as long as the second portion 18 of the metal does not contact the first portion 16 of metal.

According to the cryogenic lift-off process of the invention, after providing the layer of resist material on a surface of the substrate and applying a layer of metal thereto to form a layered article as described above, the layered article is subjected to a temperature sufficiently low to cause the resist layer 12 to detach, i.e., lift-off, from the surface of substrate 10. By layered article is meant at least the metal layer, the resist layer and the surface of the substrate. Thus at least the metal layer, the resist layer and the surface of the substrate are subjected to a temperature sufficiently low to cause the resist layer 12 to detach from the surface of the substrate 10. However, according to the invention, the layered article may comprise the metal layer, the resist layer and the entire substrate which could be subjected to the low temperature. One way to subject the layered article to a sufficiently low temperature to cause the resist layer to detach from the surface of the substrate is to subject the layered article to a cryogenic temperature, such as by exposure to liquid nitrogen. Alternately, the article could be subjected to a sufficiently low temperature by use of refrigerants, e.g., freons, or refrigerated solvents, e.g., dry ice/methanol. Still other ways to subject the layered article to such low temperatures will be apparent to those skilled in the art in view of the present disclosure.

By subjecting the layered article to the sufficiently low temperature as described above, it is believed that the difference in the coefficient of thermal expansion of the resist and the substrate induces stresses in the resist sufficient to cause tensile cracking at the resist/substrate interface. The exposure of the resist to the low temperature also makes it brittle. It is further believed that both conditions induce peeling off, breaking, and ultimately the detachment of the resist from the substrate. While such theory is advanced to explain the detachment of the resist from the surface of the substrate, neither its validity nor its understanding is necessary for the practice of the invention.

Figure 3:
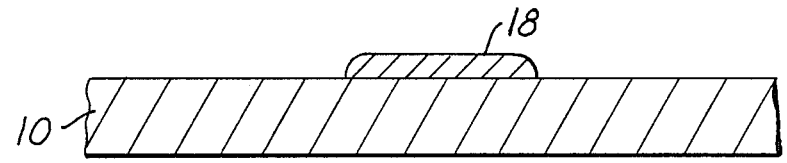

After the layered article has been subjected to the lift-off process, what remains is substrate 10 having a pattern of the second portion of metal 18, as shown in FIG. 3.

The invention will be further understood by referring to the following detailed examples. It should be understood that the subject examples are presented by way of illustration and not by way of limitation.

EXAMPLE 1

This example describes a lift-off process according to the invention. A four inch diameter (100) p-type silicon wafer, approximately 620 μm thick was cleaned in 50% $H_2O_2$-50% $H_2SO_4$ solution. The wafer was then spin coated firstly at 5000 rpm with a hexamethyl disilazane (HMDS coupling-agent) and then at 3500 rpm with Shipley 1470 (trademark, Shipley Co., Inc., Newton, Mass.) resist to produce a photoresist film of 2 μm thickness. The wafer was then soft baked at 70° C. for 15 minutes and subsequently soaked in 100% chlorobenzene for 5 minutes. The photoresist was then exposed to a pattern using a commercial mask aligner with power of 9.5 mW/cm$^2$ for 9 seconds. The pattern was developed in a 1:1 solution of Microposit Developer MF-312 (trademark, Shipley Co., Inc., Newton, Mass.):water for 2 minutes. The wafer was dried and transferred to the planetary stage of an electron beam evaporator equipped with an aluminum target. A 1 μm thick film of aluminum was then deposited onto the wafer/resist assembly. After removal from the vacuum system, the metalized wafer was submerged for approximately 5 seconds in liquid nitrogen. Upon removal, the desired pattern of aluminum was evident on the wafer and the unwanted portions of the aluminum film remained behind in the liquid nitrogen bath adhering to the photoresist which had detached from the surface of the wafer.

EXAMPLE 2

Figure 4:
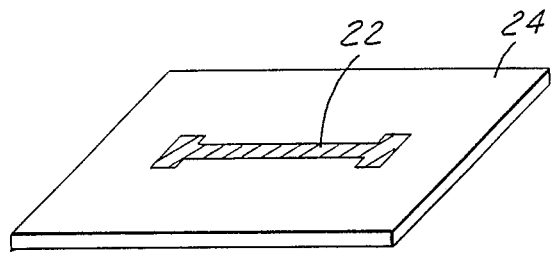
FIGS. 4, 5 and 6 illustrate a method for making a structure carrying two metallizations in contact with each other which employs a process according to the present invention.
Figure 5:
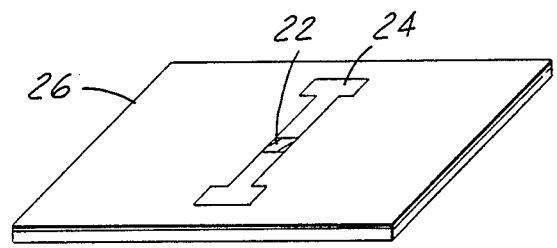
Figure 6:
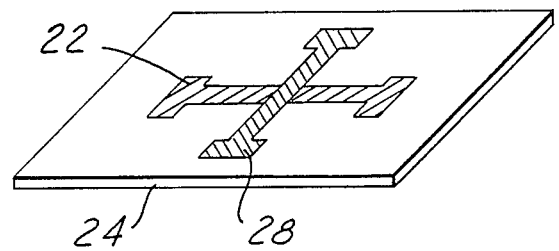

In this example, a structure comprising two metallizations on a sapphire substrate is made using (a) a substractive etching process to provide a patterned aluminum first layer and thereafter (b) the process of this invention to provide a patterned nickel second layer in contact with the first layer. As shown in FIG. 4, an aluminum first layer metallization 22 is deposited by a subtractive etching process on a sapphire substrate 24 which comprises using a positive photoresist, development, and removal of unwanted aluminum by one of the various etchants known to those familiar with the art. A second level metallization consisting of nickel is subsequently applied using the process of this invention. Specifically, as shown in FIG. 5, a resist layer 26 is provided in a pattern on the surface of the substrate which leaves an area of the substrate exposed (in this case the substrate includes portions of the sapphire substrate 24 and portions of the aluminum metallization 22). A nickel layer is then deposited on the assembly by an electron-beam evaporative process producing an overall coverage of the assembly. The assembly is then subjected to contact with a bath of liquid nitrogen. The resist and nickel lying thereon detach from the surface of the substrate according to the process of the invention, leaving behind two metallizations which are in contact as shown in FIG. 6.

In view of the disclosure, many modifications of this invention will be apparent to those skilled in the art. It is intended that all such modifications which fall within the true scope of this invention be included within the terms of the appended claims.

We claim:

1. A process for the cryogenic lift-off of metal/resist material from a surface of a substrate, which process comprises:
    providing a layer of resist material in a desired pattern on a surface of a substrate, said substrate possessing a thermal coefficient of expansion different from that of said resist material and said layer (i) defining uncovered surface areas of said substrate and (ii) having undercut side walls adjacent said uncovered surface areas;
    then applying a layer of metal whereby a first portion of said metal deposits on the surface of said resist material and a second portion of said metal deposits on said uncovered surface areas of said substrate forming a layered article, said metal being adherent to said surface of said substrate, said first portion and said portion thereof not being in contact with each other; and
    then subjecting said layered article to a temperature sufficiently low to cause said resist layer to detach from said surface of said substrate.

2. The process according to claim 1, wherein said resist material is selected from positive photoresist materials and negative photoresist materials.

3. The process according to claim 1, wherein said substrate is a semiconductor material.

4. The process according to claim 3, wherein said semiconductor material is selected from silicon, gallium arsenide and indium phosphide.

5. The process according to claim 4, wherein said substrate is a wafer of single crystal silicon.

6. The process according to claim 1, wherein said metal is selected from aluminum, iron, nickel, copper, lead, silver, chromium, tungsten, tin, platinum, molybdenum, gold and alloys of any of them.

7. The process according to claim 1, wherein said layer of metal is applied by a technique selected from evaporation and sputtering deposition methods.

8. The process according to claim 1, wherein said layered article is subjected to a cryogenic temperature to cause said resist layer to detach from said surface of said substrate.

9. The process according to claim 8, wherein said layered article is subjected to liquid nitrogen to cause said resist layer to detach from said surface of said substrate.

* * * * *